US012135985B2

(12) United States Patent
Yudanov et al.

(10) Patent No.: US 12,135,985 B2
(45) Date of Patent: Nov. 5, 2024

(54) CUSTOMIZED ROOT PROCESSES FOR GROUPS OF APPLICATIONS

(71) Applicant: Micron Technology, Inc., Boise, ID (US)

(72) Inventors: Dmitri Yudanov, Rancho Cordova, CA (US); Samuel E. Bradshaw, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/898,642

(22) Filed: Aug. 30, 2022

(65) Prior Publication Data

US 2022/0413900 A1  Dec. 29, 2022

Related U.S. Application Data (63) Continuation of application No. 16/592,537, filed on Oct. 3, 2019, now Pat. No. 11,436,041.

(51) Int. Cl.
  *G06F 9/48*  (2006.01)
  *G06F 9/38*  (2018.01)
  (Continued)

(52) U.S. Cl.
  CPC ............ *G06F 9/485* (2013.01); *G06F 9/3842* (2013.01); *G06F 11/302* (2013.01); *G06F 11/3409* (2013.01); *G11C 11/409* (2013.01)

(58) Field of Classification Search
  CPC .................................................... G06F 9/485
  See application file for complete search history.

(56) References Cited

U.S. PATENT DOCUMENTS

| 6,138,179 A | 10/2000 | Chrabaszcz et al. |
| 6,976,114 B1 | 12/2005 | Ware |

(Continued)

FOREIGN PATENT DOCUMENTS

| CN | 103631612 | 3/2014 |
| JP | 2005275707 | 10/2005 |
| WO | 2019171237 | 9/2019 |

OTHER PUBLICATIONS

Bergan, et al. "Deterministic Process Groups in dOS." The ACM Digital Library, Association for Computing Machinery, 2021.

(Continued)

*Primary Examiner* — Charlie Sun
(74) *Attorney, Agent, or Firm* — Greenberg Traurig (57) ABSTRACT

Customized root processes for groups of applications in a computing device. A computing device (e.g., a mobile device) can monitor usage of applications. The device can then store data related to the usage of the applications, and group the applications into groups according to the stored data. The device can customize and execute a root process for a group of applications according to usage common to each application in the group. The device can generate patterns of prior executions shared amongst the applications in the group based on the stored data common to each application in the group, and execute the root process of the group according to the patterns. The device can receive a request to start an application from the group from a user of the device, and start the application upon receiving the request and by using the root process of the group of applications.

19 Claims, 7 Drawing Sheets

(51) Int. Cl.
  *G06F 11/30* (2006.01)
  *G06F 11/34* (2006.01)
  *G11C 11/409* (2006.01)

(56) References Cited

U.S. PATENT DOCUMENTS

| | | |
|---|---|---|
| 7,370,288 B1 | 5/2008 | Simmons et al. |
| 8,001,266 B1 | 8/2011 | Gonzalez et al. |
| 8,042,109 B2 | 10/2011 | Johnson et al. |
| 8,402,061 B1 | 3/2013 | Briggs et al. |
| 8,607,023 B1 | 12/2013 | Kraipak et al. |
| 8,806,140 B1 | 8/2014 | Kraipak et al. |
| 8,838,887 B1 | 9/2014 | Burke et al. |
| 8,943,501 B1 | 1/2015 | Havemose |
| 9,250,891 B1 | 2/2016 | Beranek et al. |
| 10,013,500 B1 | 7/2018 | Mcclintock et al. |
| 10,606,670 B2 | 3/2020 | Zhao et al. |
| 11,366,752 B2 | 6/2022 | Yudanov |
| 11,436,041 B2 | 9/2022 | Yudanov et al. |
| 2002/0013887 A1 | 1/2002 | Ting |
| 2004/0230687 A1 | 11/2004 | Nakamura et al. |
| 2005/0060174 A1 | 3/2005 | Heyward et al. |
| 2005/0116958 A1 | 6/2005 | Walls et al. |
| 2006/0064421 A1 | 3/2006 | Futagawa |
| 2006/0085679 A1 | 4/2006 | Neary et al. |
| 2007/0101098 A1 | 5/2007 | Shin et al. |
| 2007/0130441 A1 | 6/2007 | Wooten |
| 2007/0226702 A1 | 9/2007 | Segger |
| 2008/0010431 A1 | 1/2008 | Chang et al. |
| 2008/0163169 A1 | 7/2008 | Alcott et al. |
| 2009/0049389 A1 | 2/2009 | Kuzmanovic |
| 2009/0150541 A1 | 6/2009 | Georgis |
| 2009/0205034 A1 | 8/2009 | Williams et al. |
| 2009/0265715 A1 | 10/2009 | Erlingsson et al. |
| 2009/0307693 A1 | 12/2009 | Do et al. |
| 2010/0169708 A1 | 7/2010 | Rudelic et al. |
| 2010/0205395 A1 | 8/2010 | Srinivasan |
| 2010/0312955 A1 | 12/2010 | Hwang et al. |
| 2011/0131569 A1 | 6/2011 | Heim |
| 2012/0054753 A1 | 3/2012 | Nagasaka et al. |
| 2012/0110229 A1 | 5/2012 | Woo et al. |
| 2012/0221785 A1 | 8/2012 | Chung et al. |
| 2012/0246403 A1 | 9/2012 | Mchale et al. |
| 2013/0024609 A1 | 1/2013 | Gorobets et al. |
| 2013/0060946 A1 | 3/2013 | Kenneth et al. |
| 2013/0124814 A1 | 5/2013 | Carter et al. |
| 2013/0198459 A1 | 8/2013 | Joshi et al. |
| 2014/0122329 A1 | 5/2014 | Naggar et al. |
| 2014/0201126 A1 | 7/2014 | Zadeh et al. |
| 2014/0215155 A1 | 7/2014 | Miller et al. |
| 2014/0317634 A1 | 10/2014 | Ishikawa et al. |
| 2014/0372356 A1 | 12/2014 | Bilal et al. |
| 2015/0081964 A1 | 3/2015 | Kihara et al. |
| 2015/0106548 A1 | 4/2015 | Dubois et al. |
| 2015/0106578 A1 | 4/2015 | Warfield et al. |
| 2015/0106582 A1 | 4/2015 | Mai et al. |
| 2015/0178108 A1 | 6/2015 | Tarasuk-Ievin et al. |
| 2015/0178219 A1 | 6/2015 | Aslot et al. |
| 2015/0301743 A1 | 10/2015 | Nagao et al. |
| 2016/0019206 A1 | 1/2016 | Mysur et al. |
| 2016/0085481 A1 | 3/2016 | Antony et al. |
| 2016/0210049 A1 | 7/2016 | Van Riel et al. |
| 2016/0239236 A1 | 8/2016 | Huang et al. |
| 2016/0378583 A1 | 12/2016 | Nakano et al. |
| 2017/0017576 A1 | 1/2017 | Cammarota et al. |
| 2017/0180340 A1 | 6/2017 | Smith et al. |
| 2017/0185301 A1 | 6/2017 | Mcgiverin et al. |
| 2017/0262465 A1 | 9/2017 | Goggin et al. |
| 2017/0315915 A1 | 11/2017 | Meswani |
| 2017/0357600 A1 | 12/2017 | Moon |
| 2018/0024853 A1 | 1/2018 | Warfield et al. |
| 2018/0046378 A1 | 2/2018 | Coburn et al. |
| 2018/0046411 A1 | 2/2018 | Coburn et al. |
| 2018/0204111 A1 | 7/2018 | Zadeh et al. |
| 2018/0276112 A1 | 9/2018 | Krauss |
| 2018/0284735 A1 | 10/2018 | Cella et al. |
| 2018/0293087 A1 | 10/2018 | Lee et al. |
| 2019/0042453 A1 | 2/2019 | Basak et al. |
| 2019/0050163 A1 | 2/2019 | Dewey et al. |
| 2019/0121350 A1 | 4/2019 | Cella et al. |
| 2019/0138919 A1 | 5/2019 | Chen |
| 2019/0156207 A1 | 5/2019 | Chen |
| 2019/0171187 A1 | 6/2019 | Cella et al. |
| 2019/0179763 A1 | 6/2019 | Lo |
| 2019/0188162 A1 | 6/2019 | Kwon et al. |
| 2019/0220318 A1 | 7/2019 | Yang et al. |
| 2019/0324431 A1 | 10/2019 | Cella et al. |
| 2019/0339688 A1 | 11/2019 | Cella et al. |
| 2020/0081658 A1 | 3/2020 | Choi et al. |
| 2020/0103894 A1 | 4/2020 | Cella et al. |
| 2020/0117455 A1 | 4/2020 | Ray et al. |
| 2020/0133254 A1 | 4/2020 | Cella et al. |
| 2020/0184278 A1 | 6/2020 | Zadeh et al. |
| 2020/0225655 A1 | 7/2020 | Cella et al. |
| 2020/0272566 A1 | 8/2020 | Saeki |
| 2020/0348662 A1 | 11/2020 | Cella et al. |
| 2021/0064495 A1* | 3/2021 | Huang ............... G11C 11/5628 |
| 2021/0103446 A1 | 4/2021 | Yudanov et al. |
| 2021/0103462 A1 | 4/2021 | Yudanov et al. |
| 2021/0103463 A1 | 4/2021 | Yudanov et al. |
| 2021/0157646 A1 | 5/2021 | Yudanov et al. |
| 2021/0157718 A1 | 5/2021 | Yudanov et al. |
| 2021/0255773 A1* | 8/2021 | Kwon ................... G09G 5/001 |
| 2021/0294746 A1 | 9/2021 | Yudanov |
| 2022/0197814 A1 | 6/2022 | Yudanov |

OTHER PUBLICATIONS

International Search Report and Written Opinion, PCT/US2020/053529, mailed on Jan. 20, 2021.
International Search Report and Written Opinion, PCT/US2020/053537, mailed on Jan. 20, 2021.
International Search Report and Written Opinion, PCT/US2020/053532, mailed on Jan. 22, 2021.
International Search Report and Written Opinion, PCT/US2020/061306, mailed on Mar. 9, 2021.
International Search Report and Written Opinion, PCT/US2020/061309, mailed on Mar. 9, 2021.
International Search Report and Written Opinion, PCT/US2021/063834, mailed on Apr. 14, 2022.
Xiong, et al. "Memory Access Scheduling Based on Dynamic Multilevel Priority in Shared DRAM Systems." ACM Transactions on Architecture and Code Optimization, vol. 13, No. 4, Article 42, Dec. 2016.
Supplementary European Search Report, EP20872379.1, mailed on Sep. 12, 2023.
Wikipedia, "Copy-on-write." Retrieved from the Internet <https://en.wikipedia.org/w/index.php?title=Copy-onwrite&oldid=916116133> on Aug. 14, 2023.

* cited by examiner

FIG. 7

CUSTOMIZED ROOT PROCESSES FOR GROUPS OF APPLICATIONS

RELATED APPLICATION

The present application is a continuation application of U.S. patent application Ser. No. 16/592,537, filed Oct. 3, 2019, and entitled "CUSTOMIZED ROOT PROCESSES FOR GROUPS OF APPLICATIONS," the entire disclosure of which application is hereby incorporated herein by reference.

FIELD OF THE TECHNOLOGY

At least some embodiments disclosed herein relate to root processes for computing systems in general, and more particularly to customized root processes for groups of applications in a computing device.

BACKGROUND

The innerworkings of the ANDROID operating system include a zygote that acts as a parent or root process of all ANDROID application processes. In UNIX and operating systems similar to UNIX (such as LINUX and ANDROID), any non-initial process (or any non-zero process) can be at least partially derived from the initial or zero process of the operating system (OS). Thus, the use of the term "zygote" by the ANDROID OS to reference its root process or process 0.

ANDROID is a mobile OS for mobile devices developed by GOOGLE. It is based on a modified version of the LINUX kernel and other open source software, and is designed primarily for mobile devices (e.g., smartphones, tablets, etc.). GOOGLE has also developed versions of ANDROID for the Internet of Things (IoTs). And, versions of ANDROID have been developed for televisions and other household appliances, in-vehicle information systems, wearable smart devices, game consoles, digital cameras, and other types of electronics including PCs.

The creation of a non-zero process by ANDROID, UNIX, or another OS similar to UNIX, occurs when another process executes the system call represented by "fork( )", which causes forking of a process into multiple processes. The process that invoked the forking is the parent process and a newly created process is a child process. In UNIX or operating systems similar to UNIX, the kernel can identify each process by its process identifier, e.g., "0" for the initial or zero process. In UNIX and similar operating systems, the zero process (i.e., process 0) is a root process generated when the OS boots. A first child process (e.g., process 1), known as "init", can at least be partially derived from the zero process and can become the ancestor of every other process in the OS.

BRIEF DESCRIPTION OF THE DRAWINGS

The present disclosure will be understood more fully from the detailed description given below and from the accompanying drawings of various embodiments of the disclosure.

DETAILED DESCRIPTION

At least some embodiments disclosed herein relate to root processes for computing systems in general, and more particularly to customized root processes for multiple groups of applications in a computing device.

In some embodiments disclosed herein, a group of applications can share a respective root process just for the group of applications. In such embodiments, the root process of the group of applications can pre-load a selected collection of libraries, objects, and/or pages suitable for a group of applications such that each of the applications of the group can be launched via forking of the root process of the group.

In some embodiments, an operating system, hypervisor, or the like can monitor and record critical libraries, objects, and pages for applications in a device or multiple devices (such as networked devices) and can build a database or another type of data structure to capture the usage of the libraries, objects, and pages of various applications. Captured data access and usage patterns can be used to identify a group of applications to share a root process, such that the root process becomes the respective root process for the group of applications. The operating system, hypervisor, or the like can generate and customize the root process of the group of applications based on the captured data access and usage patterns. Over time the performance of each application in a group of applications can improve because the database or the data structure can evolve with a greater amount of data access and usage patterns for the group.

Some embodiments disclosed herein relate to an OS or hypervisor or the like of one or more computing devices that is configured to monitor usage of one or more applications by a user in the one or more devices. For example, some embodiments can relate to an OS of a mobile device that is configured to monitor usage of multiple applications in the device by a user. The monitoring of applications can identify typical initial or historical or sampled reads or writes common to a group of applications that cause the OS, hypervisor, or the like to read from memory and write into memory for the group of applications. The monitoring can also include monitoring of usage patterns of related applications (e.g., data access patterns, typical day of week used by the user, time of day usually used, other applications used that correlate to use of the group of applications, etc.). The initial or historical or sampled reads and writes associated with a group of applications can be stored or cached in memory to be used via a respective root process particularly for the group of applications. The initial or historical or sampled reads and writes can be managed, maintained, prioritized etc., by the OS, hypervisor or the like, via the memory, according to frequency of use, recency of use, etc. In some embodiments, storing or caching can be done in faster memory for accelerating the initial reads and writes.

In some embodiments, instructions and/or data for the root process of a group of applications can be stored in a persistent non-volatile memory such as flash memory or non-volatile random-access memory (NVRAM). NVRAM can include 3D XPoint memory in some embodiments.

The root process for a group of applications can be launched on startup of the OS, hypervisor or the like. In some embodiments, the root process of the group can be killed if the applications in the group are not used within a certain time period or if applications consume too much system resources such as CPU, GPU, memory or other resource. In such embodiments, in anticipation of use of at least one application in the group of applications, the OS, hypervisor or the like can be configured to re-launch the root process of the group according to identified patterns in the monitoring of the group. Preference to patterns can be based on quantify, frequency and/or recency of the patterns, and any type of memory access patterns for the group of applications can be monitored and tracked. The monitoring and tracking can include hardware and software performance counters, which are available through an OS via reading and writing special registers (e.g., model specific registers). Patterns can be based on metrics such as quantity, frequency and/or recency of reads from memory, writes to memory, address patterns in physical memory space, address patterns in virtual space, locality of data (spatially and/or temporally), bank conflicts, or CPU cycles per instruction. Patterns can also be based on metrics such as quantity, frequency and/or recency of translation lookaside buffer (TLB) metrics and other metrics available to an OS.

In some embodiments, after at least one application in a group of applications is installed in a computing device (such as a mobile device), the OS of the device or an associated hypervisor can pre-launch the applications of the group to generate a root application process that is customized for the user and the group of applications. The pre-launch can occur before the user requests the computing device to start the at least one application of the group of applications. The applications of the group can be executed at least partially via an OS or hypervisor or the like. Thus, the pre-launch process or root process of the applications of the group is different from the root process of the OS. In such embodiments, the OS or hypervisor or the like can move and/or copy data to set up the root process of the group of applications. In some embodiments, the copying and/or moving of the data initially can be done by a root process of the OS. This can occur before any initial reads or writes for the applications of the group such as by a root process of the group of applications. In some embodiments, common code and read-only data (e.g. libraries, runtimes, drivers, memory pages) are not copied and/or moved by the root process of the OS or a respective root process of a group of applications. In some embodiments, code and data of a root process are not copied until initial modification of code and data by a root process, another process or the OS. In some embodiments, only modified parts of code and data are copied, but not modified parts remain common. In some embodiments these parts can be identified by monitoring writes to memory pages, cache lines or file system sectors or other elements of computer-readable storage medium.

The computing device (e.g., a mobile device) can monitor the frequent or recent usage of the group of applications by the user to determine initial reads and writes to add to the root process of the group of applications. This can cause the OS, hypervisor, or the like to read from and/or write into memory for the group of applications. The data moving and/or copying as a result of the initial writes can also be performed before the user requests the OS, hypervisor or the like to start at least one of the applications in the group.

After the OS, hypervisor, or the like forks a system-level root process, the predicted initial reads and/or writes for the group of applications can be used to customize the group's root process. In such examples, the customized root process of the group of applications can be saved in a persistent non-volatile memory (e.g., flash memory and/or NVRAM) for fast starting of one or more applications of the group of applications.

When the user requests the OS, hypervisor, or the like to start one or more applications in the group of applications, the OS, hypervisor, or the like can use the pre-launched process of the group (i.e., the root process of the group of applications), or a forked process derived from the pre-launched process to service the user. The forked process from the root process of the group of applications can be similar to or different from the root process of the group of applications.

Also, when the user kills the applications of the group of applications, the OS can kill the active processes of the applications of the group and/or the root process of the group, completely or partially. In anticipation that the user will run at least one of the applications of the group of applications, the OS, hypervisor, or the like can re-launch the root process of the group of applications, which can be further customized based on most recent and/or frequent user usage patterns of the applications of the group.

Figure 1:
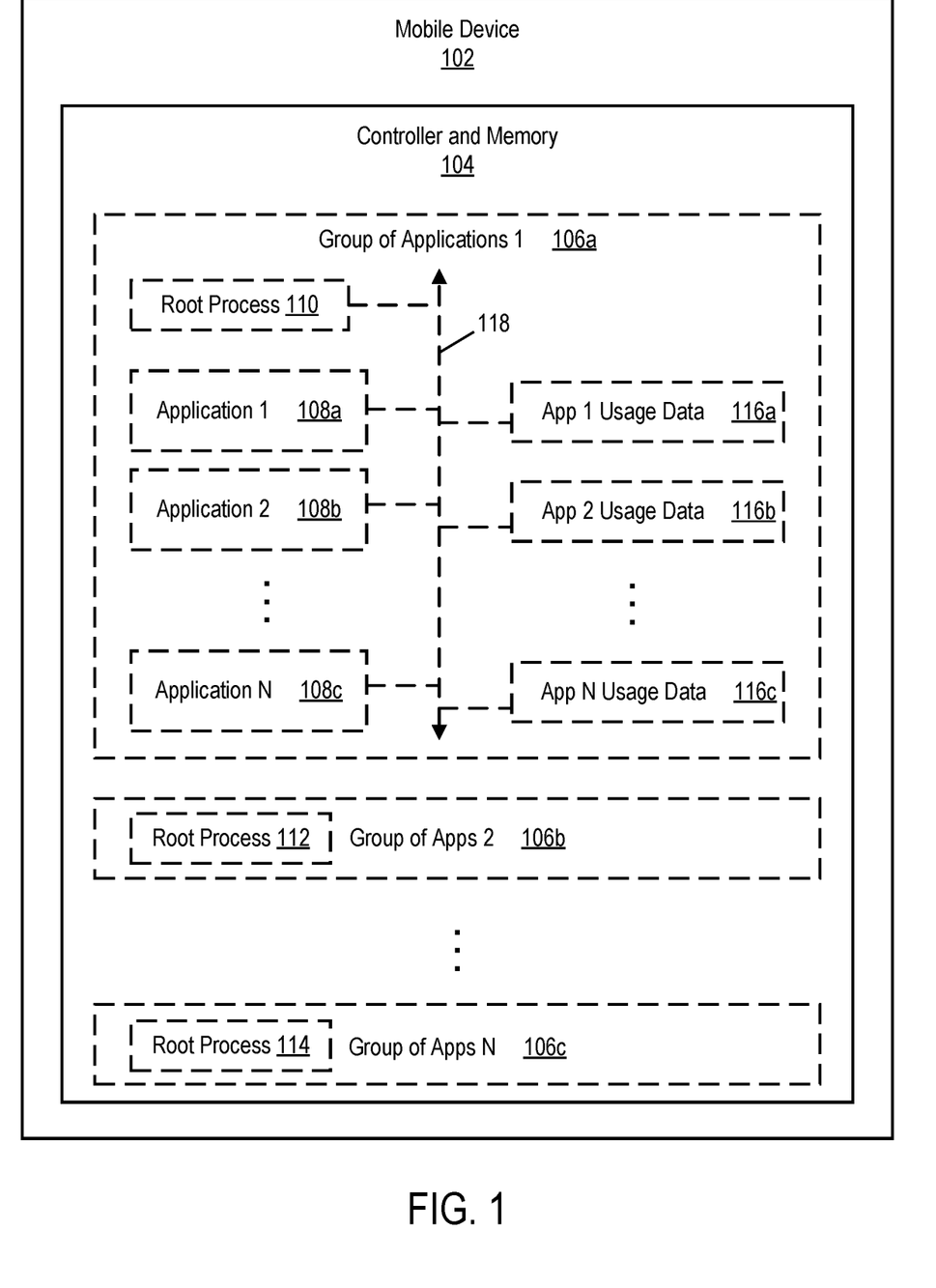
FIGS. 1 and 4 illustrate an example mobile device including and running respective root processes for multiple groups of applications, in accordance with some embodiments of the present disclosure.
Figure 3:
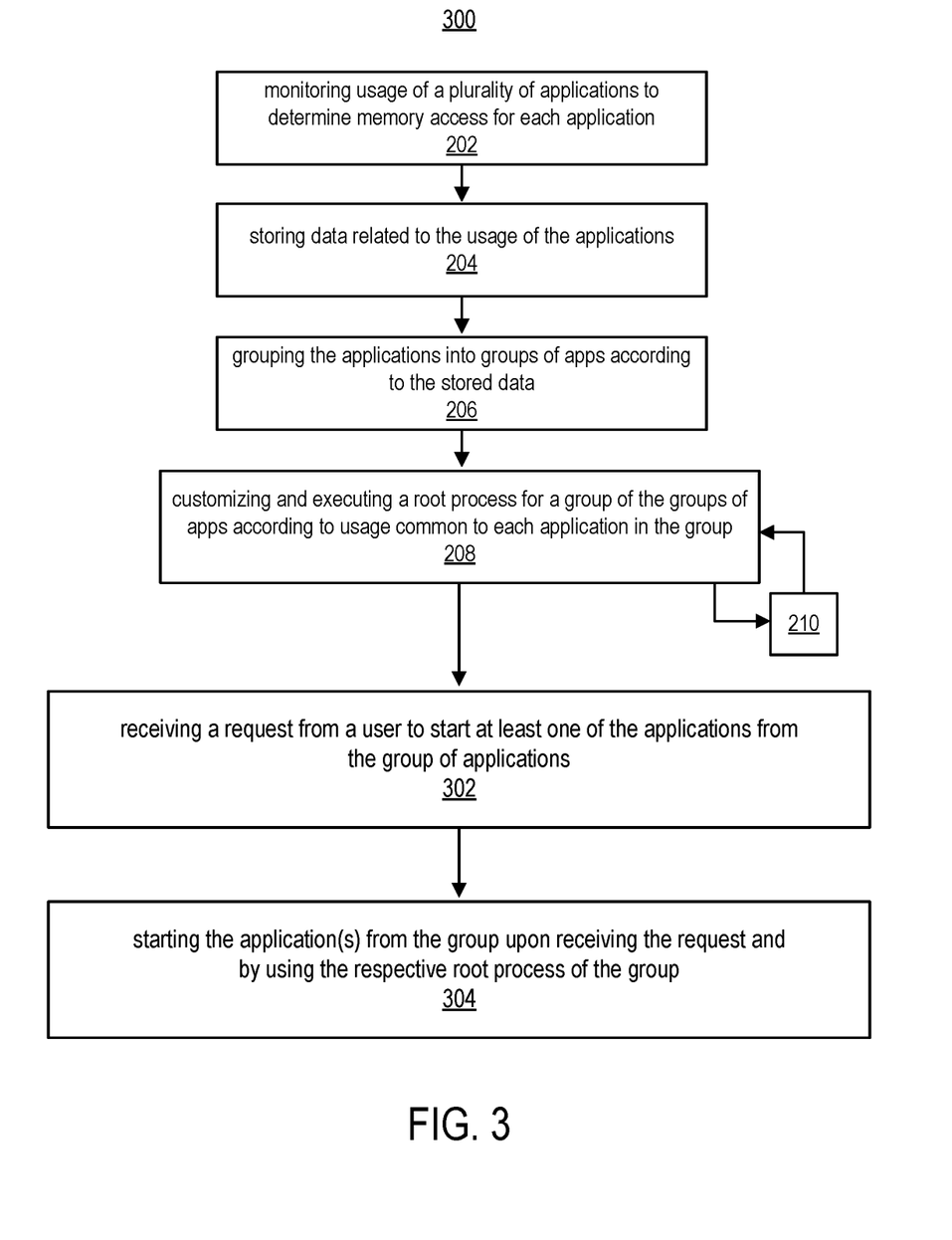
Figure 4:
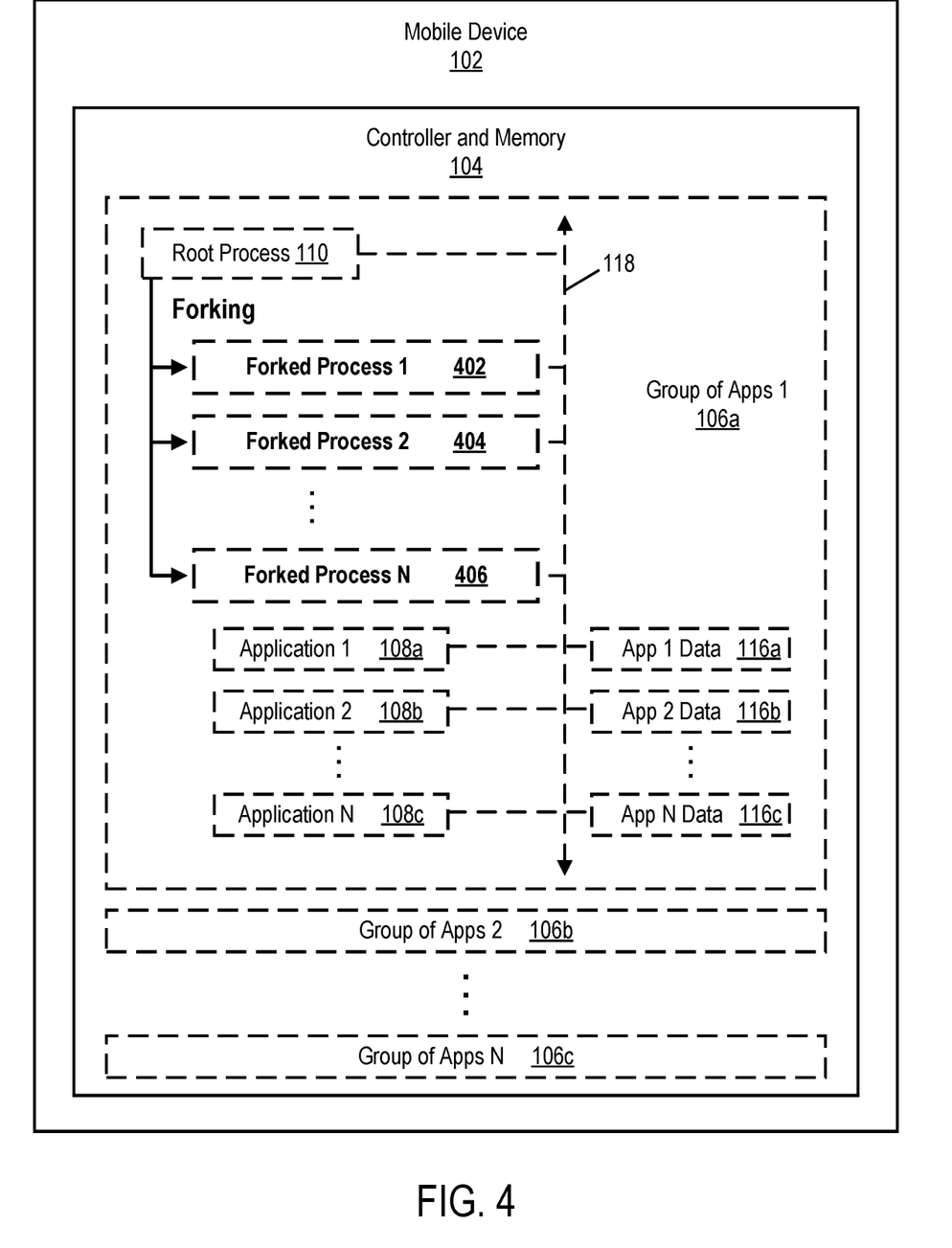

FIGS. 1 and 4 illustrate an example mobile device 102 including and running respective root processes for multiple groups of applications, in accordance with some embodiments of the present disclosure. FIGS. 2, 3, 5, and 6 illustrate flow diagrams of example methods 200, 300, 500, and 600 that can be performed by the mobile device 102 depicted in FIGS. 1 and 4, in accordance with some embodiments of the present disclosure.

Specifically, FIG. 1 Illustrates mobile device 102 that at least includes a controller and memory 104. The controller and memory 104 of mobile device 102 can include instructions and data for applications executed in the mobile device (e.g., see applications 108a, 108b, and 108c of group of applications 106a). The controller of the mobile device 102 can execute the instructions for the applications based on the data. The data can include application instruction code in binary format or in a format suitable for interpreting by programming language interpreter. The data can include some data structures, libraries etc. The controller can also hold the instructions and data in registers of the controller. The data can include application instruction code in binary format or in a format suitable for interpreting by programming language interpreter. The data can include some data structures, libraries etc. The memory can hold the instructions and data in its memory cells. In some embodiments, the memory cells of the memory of the mobile device 102 can include flash memory cells and/or NVRAM cells. The NVRAM cells can be or include 3D XPoint memory cells.

In some embodiments, the memory can have different speeds, latencies, bandwidths and other parameters. For example, SRAM memory can be used as high-speed cache, DRAM as the main memory, and NVRAM as storage memory.

For a group of applications (e.g., see groups of applications 106a, 106b, and 106c), the instructions and data for applications in the group included and runnable in the mobile device 102 can include root process data and instructions for a root process of the group of applications. The respective root process of each group of applications included in the mobile device 102 (e.g., see root process 110 of group of applications 106a, root process 112 of group of applications 106b, and root process 114 of group of applications 106c) can be implemented by the controller and the memory 104. The controller can be configured to execute the instructions of the root process of the group according to the instructions and data for the root process, and the memory can be configured to hold or store the instructions and the data for execution of the root process by the controller.

The other processes of the group of applications included in the mobile device 102 (e.g., see applications 108a, 108b and 108c, in which each application has other processes) can be implemented by the controller and the memory 104 too. The controller can be configured to execute the instructions of the other processes of the group of applications according to the instructions and data for the other processes, and the memory can be configured to hold or store the instructions and the data for execution of the other processes by the controller.

In the mobile device 102, usage of a plurality of applications (e.g., see applications 108a, 108b and 108c) can be monitored to determine memory access for each of the plurality of applications. Data related to the usage of the plurality of applications (e.g., see application usage data 116a, 116b, and 116c) can be stored in the mobile device, such as in the memory of the mobile device (e.g., see controller and memory 104). The plurality of applications can also be group into groups (e.g., see groups of applications 106a, 106b, and 106c) according to data related to usage of the plurality of applications (e.g., see application usage data 116a, 116b, 116c). As shown, logical connections of a group of applications can logically associate or connect application usage data with corresponding applications belonging to the group as well as the root process of the group (e.g., see logical connections 118). The root process of a group of applications (e.g., see root processes 110, 112, and 114) can also be customized and executed according to usage data common to each application in the group (e.g., see application usage data 116a, 116b, and 116c which can include common data that links applications 108a, 108b, and 108c). The commonality between usage data of applications in a group can be determined via logical connections (e.g., see logical connections 118). In some embodiments, the logical connections may be implemented by a relational database stored and executed by the controller and memory 104. An entry in such a database can describe each connection. For instance, application 108a may be connected to application 108b because they share a common object (e.g., where they both read-write data related to capturing user voice during mobile phone calls). In some embodiments, more than one root processes per group can exist. In other embodiments, one application can belong to multiple groups. For example, referring to FIG. 1 an application 116c can belong to group of application 1 and group of application 2 (not shown).

Figure 2:
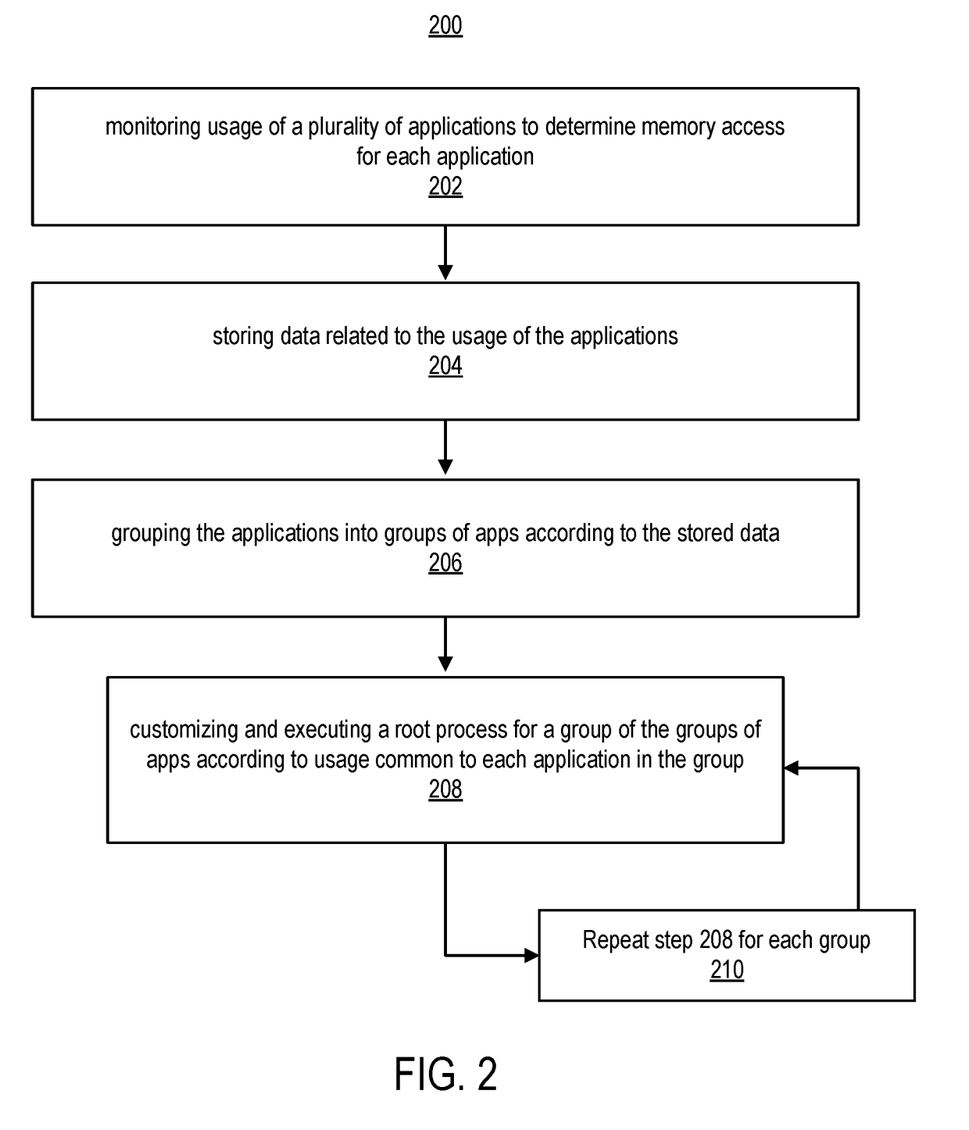
FIGS. 2, 3, 5, and 6 illustrate flow diagrams of example operations that can be performed by the mobile device depicted in FIGS. 1 and 4, in accordance with some embodiments of the present disclosure.

Specifically, FIG. 2 illustrates operations of method 200 that can be performed by the mobile device 102 depicted in FIG. 1 or by another type of computing device configured similarly to the mobile device 102. Also, in some embodiments, the method 200 can be performed at least partially by an OS of a computing device in general or an OS of a mobile device such as mobile device 102. The method 200 can also be performed at least partially by a hypervisor and/or one or more operating systems.

In FIG. 2, the method 200 begins at step 202 with monitoring usage of a plurality of applications to determine memory access for each application. Step 202 can include monitoring usage of the applications to determine frequency or recency of reads from and writes to memory for the applications in a device such as a mobile device. In some embodiments, step 202 can include monitoring and/or tracking usage of the applications to determine quantity, frequency and/or recency of patterns of prior executions of the applications.

The monitoring and tracking usage of the applications at step 202 can occur during initiation of applications (e.g., including when the applications are being loaded to memory) and/or afterwards during running of the applications. The monitoring and tracking usage of the applications can occur during initiation of the application and at any other period of running the applications post-initiation. Monitoring and tracking usage of the applications during runtime can facilitate derivation of effective and/or efficient respective root processes of the applications. For example, after initiation a user can touch a screen to trigger some element of an application and expect some result. The delivery of that result can be very quick in some embodiments since a critical memory object can be preloaded based on the monitoring that occurs during runtime of the application. In some embodiments, the preloading of the object can be done from slower memory such as NAND-type Flash memory to faster memory such as DRAM.

Step 202 can also include generating the patterns of prior executions of the applications according to the frequency or recency of reads from and writes to memory for the applications. In some embodiments (not depicted), the method 200 can continue with generating the patterns of prior executions of the applications according to the quantity, frequency and/or recency of patterns in prior executions of the applications that are monitored and/or tracked.

At step 204, the method 200 continues with storing data related to the usage of the applications. The storing of the data related to the usage of the applications can occur in a device such as a mobile device in which the applications are executed. The storage of the data can occur in memory and/or a data storage system of the device. In some embodiments storing new data can overwrite old unused data related to the usage of the applications.

At step 206, the method 200 continues with grouping the applications into groups of applications according to the stored data. In some embodiments, grouping the applications can be done directly from the step 202, and simultaneously with storing data at step 204. In other examples, step 204 can be completely bypassed in order to speed-up the grouping at step 206.

At step 208, the method 200 continues with customizing and executing a root process for a group of applications of the groups of applications formed at step 206. The customizing and executing of the root process of the group is according to usage common to each application in the group—such as being based on usage data common to each application in the group. At step 208, the method 200 can include customizing a root process of a group of applications according to patterns of prior executions of the applications in the group, and then executing the root process of the group of applications to an initial point according to the patterns of prior executions of the applications in the group. Customizing a root process can be done, but not limited to, composing it from various libraries, using other root processes available by default, forming data structures, and querying various sources over the network for root process components.

At step 210, method 200 continues with customizing and executing another root process for another group of the groups of applications according to usage common to each application in the other group. To put it another way, step 210 repeats step 208 for another group of the groups of applications. Also, step 210 includes repeating step 208 for each group of the groups of applications formed at step 206. In some embodiments, repeating can be replaced with performing step 208 concurrently for a number of groups. In other embodiments, customizing may detect inability to customize a root process for some applications in a group. In this case, upon determination of this condition, step 208 may return back to step 206 where re-grouping of applications among groups can be done.

With respect to steps 208 and 210, patterns of prior executions of applications in a group of applications can include, be related to, or be based on at least quantity, frequency and/or recency of patterns in prior executions of the applications of the group that are monitored and/or tracked. The patterns monitored and/or tracked can be any type of pattern of application usage by a user or a machine. For example, any type of pattern of memory access and usage for the applications in a group can be monitored and/or tracked. Patterns of prior executions of the applications in a group can include, be related to, or be based on metrics such as at least quantity, frequency and/or recency of any type of pattern of application usage by a user or a machine. For example, patterns can be based on metrics such as quantity, frequency and/or recency of reads from memory, writes to memory, address patterns in physical memory space, address patterns in virtual space, locality of data (spatially and/or temporally), bank conflicts, or CPU cycles per instruction. Patterns can also be based on metrics such as quantity, frequency and/or recency of TLB metrics and other metrics available to an OS.

The executing the root process of the applications of a group can include moving data in memory before any initial writes to and/or reads from memory for the applications. Also, the executing the root process of the applications in the group can include copying data in memory before any initial writes to and/or reads from memory for the applications. And, the moved and/or copied data can include data related to the patterns of prior executions of the applications in the group. In some embodiments, the moving and/or copying of data in memory before any initial writes to memory can include avoiding moving and/or copying common code and read-only data. In some embodiments, the method 200 can include, after an OS (or hypervisor) in the computing device forks a root process for the OS (or hypervisor), executing predicted initial writes and/or reads for the applications in the group to customize the executing of the root process of the applications such that the root process of the applications is an application-level process for the group of applications.

Also, although not depicted in the drawings, the method 200 can include storing data for the root process of the group of applications in flash memory before at least part of the execution of the root process. The method 200 can also include storing data for the root process of the group of applications in NVRAM before at least part of the execution of the root process (not depicted in the drawings). The NVRAM can include 3D XPoint memory.

Specifically, FIG. 3 illustrates operations of method 300 that can be performed by the mobile device 102 depicted in FIG. 1 or by another type of computing device configured similarly to the mobile device 102. Also, in some embodiments, the method 300 can be performed at least partially by an OS of a computing device in general or an OS of a mobile device such as mobile device 102. The method 300 can also be performed at least partially by a hypervisor and/or one or more operating systems.

As shown, the method 300 begins with method 200 also depicted in FIG. 2. As shown in FIG. 3, method 300 includes the step 202 of monitoring usage of applications to determine memory access for each application, as well as the step 204 of storing data related to the usage of the applications. Method 300 also includes the step 206 of grouping the applications into groups of applications according to the stored data. And, method 300 includes the step 208 of customizing and executing a root process for a group of applications of the groups of applications according to usage common to each application in the group, as well as repeating step 208 for each group of the groups of applications at step 210.

At step 302, the method 300 continues with receiving a request from a user to start at least one of the applications from the group of applications of the groups of applications. This can occur after step 208, subsequent to the customizing and executing of the root process for the group of applications. In some embodiments, step 208 can be implemented as a continuous process, and step 302 can be done concurrently and at any time during steps 208 to 210. In other embodiments all steps of method 200 can be implemented as continuous processes running concurrently and linking from one to the other upon a need, when a necessary change needs to be done. For instance, if at step 202 it is determined that patterns are changed, then a change is propagated to the next step 204 and so forth.

At step 304, the method 300 continues with starting the at least of one of the applications from the group of applications upon receiving the request and by using the root process of the group.

In some embodiments, the method 300 can include executing, at least partially by an OS in a computing device, a root process of a group of applications as a background process according to patterns of prior executions of the applications. In such embodiments, the method 300 can also include receiving, by the OS, a request to start at least one of the applications in the group from a user of the computing device. And, the method 300 can include starting, by the OS, the application(s) in the computing device upon receiving the request to start the application(s) and by using the root process of the group of applications or a forked process of the root process of the group of applications. In some embodiments, code and data of a forked process are not copied until an initial modification of code and data by the application, another process or the OS. In some embodiments, only modified parts of code and data are copied, but not modified parts remain common. In some embodiments, such parts can be identified by monitoring writes to memory pages, cache lines or file system sectors or other elements of computer-readable storage medium.

In some embodiments, the method 300 can include executing, in a computing device (e.g., a mobile device) or multiple computing devices, a root process of a group of applications to an initial point according to patterns of prior executions of the applications in the group—at step 208. The method 300 can also include receiving, by the computing device(s), a request to start at least one of the applications in the group from a user of the computing device(s)—at step 302. The method 300 can also include starting the application(s) in the computing device(s) upon receiving the request to start the application(s) and by using the root process of the group of applications—at step 304. In such embodiments, each step or at least some of the steps of method 300 can be performed by an operating system of the computing device(s), one or more operating systems of the computing device(s), a hypervisor, or any combination thereof. For example, at least one of the executing, receiving, or starting steps can be performed by an OS in the computing device(s). In some embodiments, executing a root process to an initial point can be done on one device, e.g. in cloud computing environment, then forking it upon receiving a request from another device to start at least one of the applications at step 302, then transferring a forked process over network to another device, e.g. mobile device, then using the forked process on a mobile deice as a starting point for application in step 304.

Specifically, FIG. 4 Illustrates the mobile device 102, which at least includes the controller and memory 104. As shown in FIG. 4, the controller and memory 104 of mobile device 102 can include instructions and data for applications executed in the mobile device (e.g., see applications 108a, 108b, and 108c). The controller of the mobile device 102 can execute the instructions for the applications based on the data. The data can include application instruction code in binary format or in a format suitable for interpreting by programming language interpreter. The data can include some data structures, libraries etc. The controller can also hold the instructions and data in registers of the controller. The memory can hold the instructions and data in its memory cells. In some embodiments, the memory cells of the memory of the mobile device 102 can include flash memory cells and/or NVRAM cells.

With respect to the mobile device 102 shown in FIG. 4, for a group of applications (e.g., see groups of applications 106a, 106b, and 106c), the instructions and data for applications in the group included and runnable in the mobile device 102 can include root process data and instructions for a root process of the group of applications. The respective root process of each group of applications included in the mobile device 102 (e.g., see root process 110 of group of applications 106a, root process 112 of group of applications 106b, and root process 114 of group of applications 106c) can be implemented by the controller and the memory 104. The controller can be configured to execute the instructions of the root process of the group according to the instructions and data for the root process, and the memory can be configured to hold or store the instructions and the data for execution of the root process by the controller. And, the other processes of the group of applications included in the mobile device 102 (e.g., see applications 108a, 108b and 108c, in which each application has other processes) can be implemented by the controller and the memory 104 too. The controller can be configured to execute the instructions of the other processes of the group of applications according to the instructions and data for the other processes, and the memory can be configured to hold or store the instructions and the data for execution of the other processes by the controller.

In FIGS. 1 and 4, it is shown that a root process corresponds to a group of applications (e.g., see root process 110 and corresponding group of applications 106a). It is to be understood that in a group of applications one root process can be forked into multiple processes that can be used by two or more applications in the group. Also, a single application can use multiple different forked processes. For example, application 108a can use forked processes 402, 404, and 406. Also, as mentioned, multiple applications can use multiple different forked processes. For example, applications 108a, 108b, and 108c can use forked processes 402, 404, and 406. Such embodiments can be implemented by merging forking. In other embodiments, one application can belong to multiple groups. For example, referring to FIG. 4 an application 116c can belong to group of application 1 and group of application 2. In this case merging forking may happen cross multiple groups.

In some embodiments, an initial execution of a forked root process can be limited to pre-loading libraries, composing a forked process out of required libraries and initial data structures, and saving the forked process for further reuse. Also, at any time, execution of a forked process can be saved in memory at some state so that it can be re-used in order to avoid spending time on re-executing the process.

Also, in the mobile device 102 depicted in FIG. 4, usage of a plurality of applications (e.g., see applications 108a, 108b and 108c) can be monitored to determine memory access for each of the plurality of applications. Data related to the usage of the plurality of applications (e.g., see application usage data 116a, 116b, and 116c) can be stored in the mobile device, such as in the memory of the mobile device (e.g., see controller and memory 104) or over a network in a cloud space. The plurality of applications can also be group into groups (e.g., see groups of applications 106a, 106b, and 106c) according to data related to usage of the plurality of applications (e.g., see application usage data 116a, 116b, 116c). As shown, logical connections of a group of applications can logically associate or connect application usage data with corresponding applications belonging to the group as well as the root process of the group (e.g., see logical connections 118). The root process of a group of applications (e.g., see root processes 110, 112, and 114) can also be customized and executed according to usage data common to each application in the group (e.g., see application usage data 116a, 116b, and 116c which can include common data that links applications 108a, 108b, and 108c). The commonality between usage data of applications in a group can be determined via logical connections (e.g., see logical connections 118).

Additionally, as shown in FIG. 4, the controller and memory 104 can include data and instructions for multiple processes forked from a respective root process of a group of applications stored and runnable in the mobile device 102 (e.g., see forked processes 402, 404, and 406). As shown in FIG. 4, at least forked processes 402, 404, and 406 are forked from root process 110 of the group of applications 106a; but, there may be more processes forked from root process 110.

In some embodiments, an operating system of the mobile device 102, or a hypervisor in or associated with the mobile device, is configured to fork a root process of a group of applications (e.g., see root process 110 of group of applications 106a) into multiple processes (e.g., see forked processes 402, 404, and 406). In such embodiments, the operating system, or the hypervisor, can be configured to start one or more applications in the mobile device 102 upon receiving a request to start the one or more applications and by using at least one of the multiple forked processes (e.g., see forked processes 402, 404, and 406) and/or the respective root process of the group of applications (e.g., see root process 110) according to the request to start the application(s). In some embodiments, each forked process can be for one of the applications requested to be started. For example, if four processes are forked from the root process, the four forked processes can be for four different applications in the group that were requested to be started by the user of the mobile device.

At least some or each of the forked multiple processes can be different from the parent root process of the group of applications. The differences can be based on different applications and different application parts in the computing device to be run. And, at least some or each of the forked multiple processes can be identical to the parent root process of the group of applications at least at some point of execution of the applications requested to be started.

Figure 5:
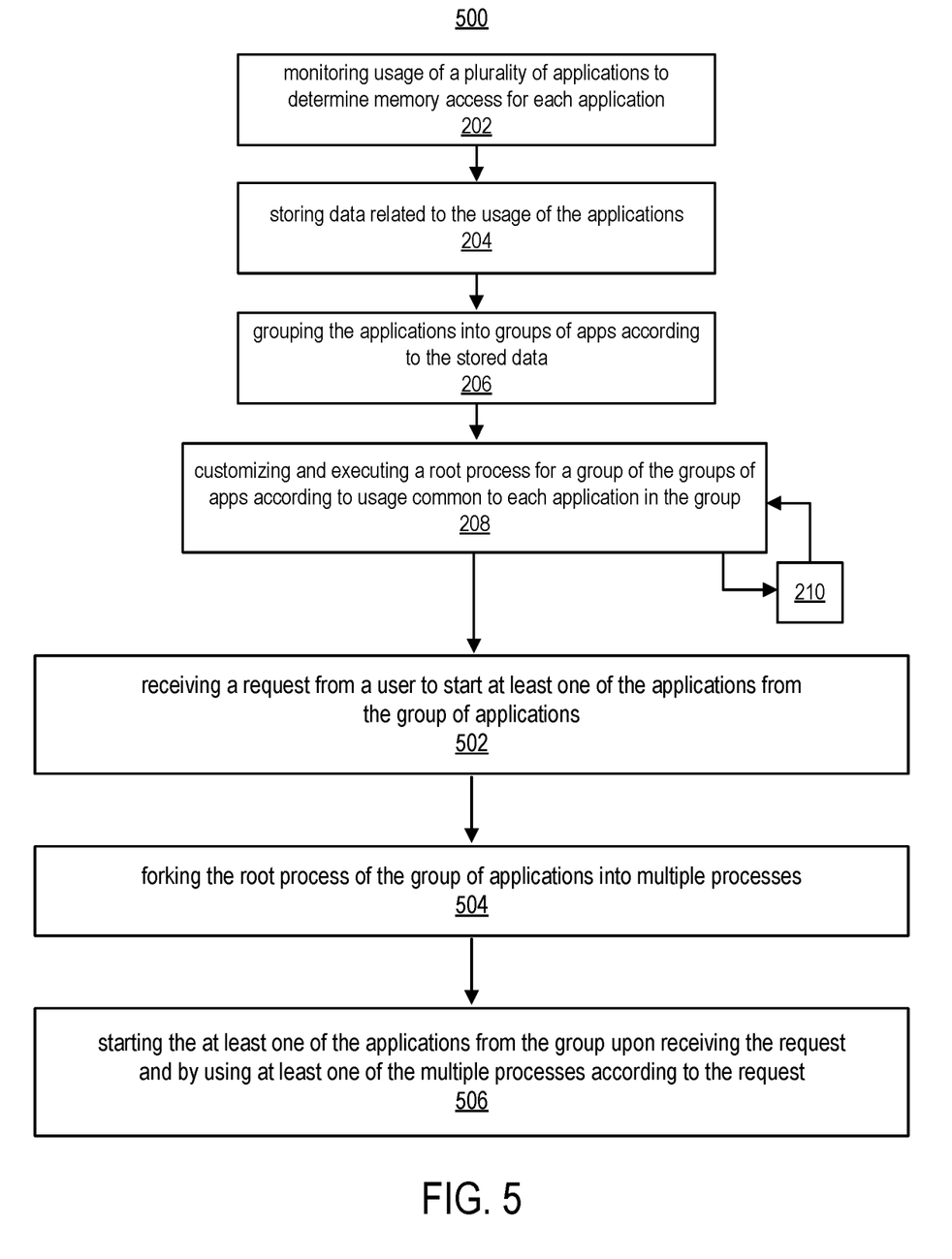

Specifically, FIG. 5 illustrates operations of method 500 that can be performed by the mobile device 102 depicted in FIG. 4 or by another type of computing device configured similarly to the mobile device 102. Also, in some embodiments, the method 500 can be performed at least partially by an OS of a computing device in general or an OS of a mobile device such as mobile device 102. The method 500 can also be performed at least partially by a hypervisor and/or one or more operating systems.

As shown, the method 500 begins with method 200 also depicted in FIG. 2. As shown in FIG. 5, method 500 includes the step 202 of monitoring usage of applications to determine memory access for each application, as well as the step 204 of storing data related to the usage of the applications. Method 500 also includes the step 206 of grouping the applications into groups of applications according to the stored data. And, method 500 includes the step 208 of customizing and executing a root process for a group of the groups of applications according to usage common to each application in the group, as well as repeating step 208 for each group of the groups of applications at step 210.

At step 502, the method 500 continues with receiving a request from a user to start at least one of the applications from the group of applications of the groups of applications. This can occur in a device of the user such as a mobile device of the user. The step 502 can occur after the customizing and executing of the root process of the group of applications.

At step 504, the method 500 continues with forking the root process of the group of applications into multiple processes. Initially, the forked multiple processes can be different from the root process or identical depending on the implementation.

At step 506, the method 500 continues with starting the at least one of the applications from the group of applications upon receiving the request and by using at least one of the forked multiple processes according to the request.

In such embodiments, each step or at least some of the steps of method 500 can be performed by an operating system of the computing device(s), one or more operating systems of the computing device(s), a hypervisor, or any combination thereof. For example, at least one of the executing, receiving, or starting steps can be performed by an OS in the computing device(s). In some embodiments, the method 500 can include forking the root process of the group of applications into multiple identical processes—at step 504, and starting the application(s) in the mobile device upon receiving the request to start the application(s) and by using at least one of the multiple identical processes according to the request to start the application(s)—at step 506.

With respect to method 500, at least some or each of the forked multiple processes can be different from the parent root process of the group of applications. The differences can be based on different applications and different application parts in the computing device to be run. And, at least some or each of the forked multiple processes can be identical to the parent root process of the application at least at some point of execution of the applications in the group.

In some embodiments, such as embodiments that can implement methods 300 and 500, the patterns of prior executions of the applications in a group are from use of the applications on a particular computing device (e.g., a particular mobile device) by a particular user and other users so that the root process is customized for use of the group of applications on the particular computing device by any user.

In some other embodiments, such as some other embodiments that can implement methods 300 and 500, the patterns of prior executions of the applications in the group are from use of the applications on a particular computing device (e.g., a particular mobile device) by a particular user so that the root process of the group of applications is customized for use of the group of applications on the particular mobile device by the particular user.

In some other embodiments, such as some other embodiments that can implement methods 300 and 500, the patterns of prior executions of the applications in the group are from use of the particular applications on a particular computing device (e.g., a particular mobile device) and on at least one other computing device by a particular user so that the root process is customized for use of the group of applications on the computing device and the at least one other computing device by the particular user.

Figure 6:
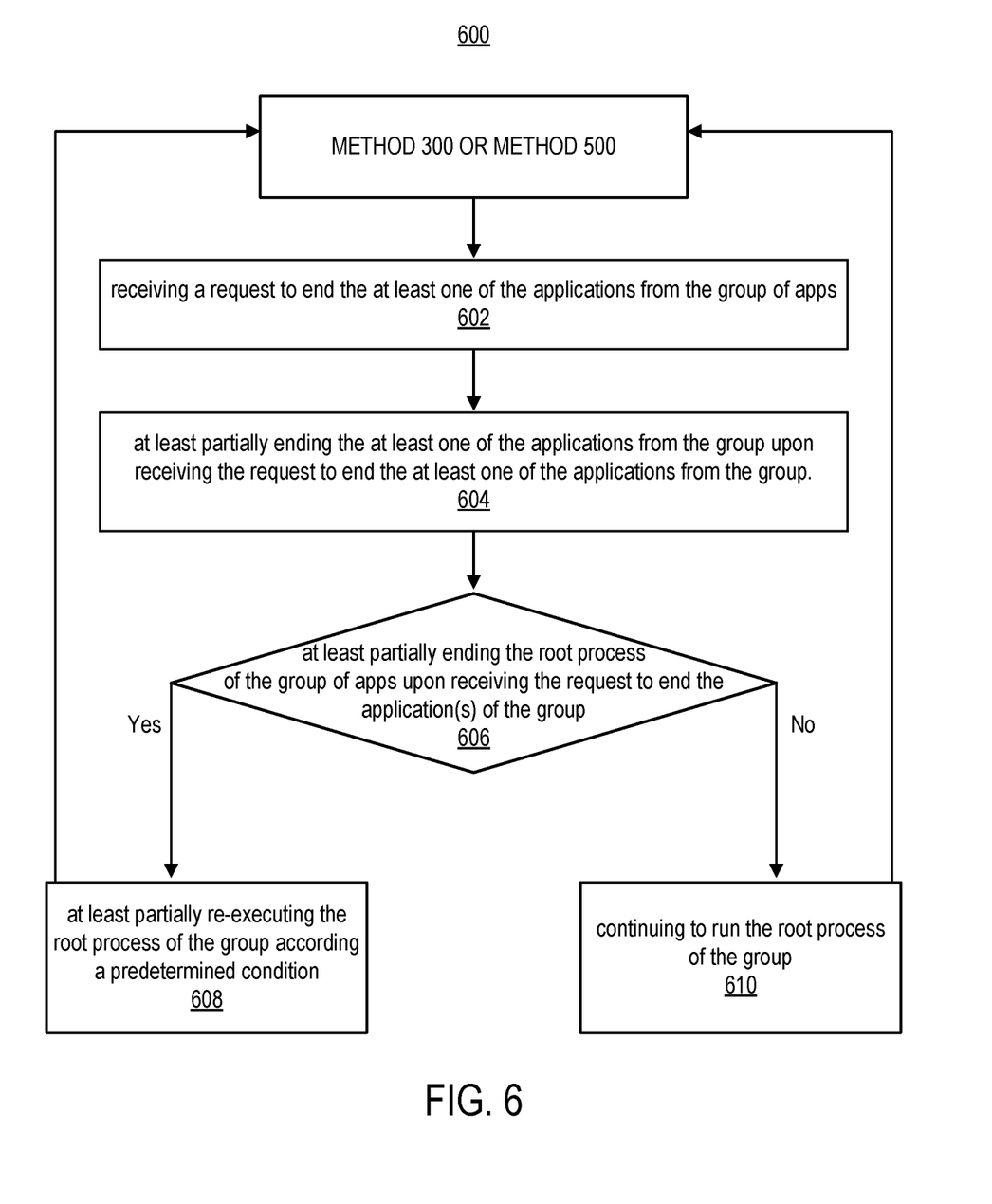

Specifically, FIG. 6 illustrates operations of method 600 that can be performed by the mobile device 102 depicted in FIGS. 1 and 4 or by another type of computing device configured similarly to the mobile device 102. Also, in some embodiments, the method 600 can be performed by an operating system of a computing device in general or an operating system of a mobile device. The method 600 can also be performed at least partially by a hypervisor and/or one or more operating systems.

As shown in FIG. 6, the method 600 begins with either method 300 shown in FIG. 3 or method 500 shown in FIG. 5. Then, the method 600 continues with, at step 602, receiving a request to end at least one of the applications from a group of applications of the groups of applications. This can occur after method 300 or method 500 occurs at least partially.

At step 604, the method 600 continues with at least partially ending the at least one of the applications from the group of applications upon receiving the request to end the at least one of the applications from the group. In some embodiments, during ending of the application, a root process of the application can be extracted by removing specific modules of the application (e.g., GUI, or libraries, etc.). The root process can become an abridged customized version of the application, which then can be re-used for the application or it can be used by other applications in the group, or it can be used when generating a main root process for the group by taking many root processes of applications after the ended application. This can be followed by analyzing the applications of the group and composing a main root process for the group. As a result, the device or system can create a highly tunable system of customized root processes based on actual application execution.

At step 606, the method 600 continues with at least partially ending the respective root process of the group of applications upon receiving the request to end the at least one application from the group.

As shown in FIG. 6, at step 608, when step 606 is completed, the method 600 can continue with at least partially re-executing the respective root process according a predetermined condition—after at least partially ending the at least one application and the respective root process. At step 608, the at least partially re-executing of the respective root process of the group can occur based on the patterns of prior executions of the applications in the group. Also, at step 608, the at least partially re-executing of the root process can be updated by the patterns of prior executions of the applications of the group.

As shown in FIG. 6, at step 610, when step 606 is not completed, the method 600 can move forward with continuing to run the root process of the group of applications upon receiving the request to end the at least one application. In other words, the method 600 can include receiving a request to end the at least one application from the user of the mobile device at step 602, and then at step 604, it can include at least partially ending the at least one application upon receiving the request to end the application, and then at step 610, it can include continuing to run the root process of the group of applications upon receiving the request to end the application(s) and without stopping the root process of the group in between steps 604 and 610. As a result of this, the root process of the application can be re-used again should the user decide to re-start the at least partly ended application or other application, for which this root-process can be used.

With respect to the method 200, method 300, method 500, method 600, or any other method, process, or operation described herein, in some embodiments, a non-transitory computer-readable storage medium stores instructions that, when executed by at least one processing device (such as controller 706 shown in FIG. 7), cause the at least one processing device to perform the method 200, method 300, method 500, method 600, or any other method, process, or operation described herein, and/or any combination thereof.

For example, some embodiments can include a non-transitory computer-readable storage medium tangibly encoded with computer-executable instructions, that when executed by a processor associated with a computing device, performs a method such as the method 200 shown in FIG. 2. Also, for example, some embodiments can include a non-transitory computer-readable storage medium tangibly encoded with computer-executable instructions, that when executed by a processor associated with a computing device, performs a method such as the method 300 shown in FIG. 3, the method 500 shown in FIG. 5, and the method 600 shown in FIG. 6.

In some embodiments, step 202 (e.g., shown in FIG. 2) can include monitoring, in a mobile device, usage of a plurality of applications to determine memory access for each of the plurality of applications. Step 204 can include storing data related to the usage of the plurality of applications. Step 206 can include grouping the plurality of applications into groups according to data related to usage of the plurality of applications. Step 208 can include customizing and executing a root process for a group of the groups of applications according to usage common to each application in the group.

In some embodiments, at least one of the monitoring, storing, grouping, or executing is performed by an OS in the mobile device. And, in some embodiments, the determining memory access can include measuring frequency or recency of reads from and writes to memory.

In some embodiments, at step 202, the monitoring of the usage of the plurality of applications is for the usage of the plurality of applications by the user so that the root process is customized for use of the applications on the mobile device by the user.

In some embodiments, step 204 can include storing data related to the usage of the plurality of applications in a database. And, in some embodiments step 208 can include executing the root process of the group to a point common to the applications in the group.

In some embodiments, step 208 can include generating patterns of prior executions shared amongst the applications in the group based on the data in the database common to each application in the group. And, step 208 can include executing the root process of the group according to the patterns of prior executions shared amongst the applications in the group.

In some embodiments, the monitoring of the usage of the plurality of applications at step 202 is for the usage of the plurality of applications by any user of the mobile device so that the root process is customized for use of the application on the mobile device by any user. In some embodiments, executing the root process for the group at step 208 can include copying data in memory before any initial writes to memory for the group, and the copying data in memory before any initial writes to memory can include avoiding copying common code and read-only data.

Some embodiments can include monitoring, by an OS in a mobile device, usage of a plurality of applications to determine frequency or recency of reads from and writes to memory for each of the plurality of applications—at step 202. Such embodiments can include storing, by the OS, data related to the usage of the plurality of applications in a database—at step 204. And, such embodiments can include grouping, by the OS, the plurality of applications into groups according to queries of the database at step 206, as well as executing, at least partially by the OS, a root process for a group of the groups as a background process according to data in the database common to each application in the group at step 208.

In some embodiments, step 302 (shown in FIG. 3) can include receiving a request to start at least one of the applications from the group from a user of the mobile device. Step 304 can include starting the at least one of the applications from the group in the mobile device upon receiving the request and by using the root process.

In some embodiments, step 504 (shown in FIG. 5) can include forking, by an OS in the mobile device, the root process into multiple processes. Step 506 can include starting, by the OS, the at least one of the applications from the group upon receiving the request and by using at least one of the multiple processes according to the request.

In some embodiments, step 602 (shown in FIG. 6) can include receiving, from the user of the mobile device, a request to end the at least one of the applications from the group. Step 604 can include at least partially ending the at least one of the applications from the group and step 606 can include at least partially ending the root process upon receiving the request to end the at least one of the applications from the group. Step 608 can include after at least partially ending the at least one of the applications from the group and the root process, at least partially re-executing the root process according a predetermined condition. The at least partially re-executing of the root process can be based on or updated by the patterns of prior executions shared amongst the applications in the group. Step 610 can include continuing to run the root process upon receiving the request to end the at least one of the applications from the group.

In some embodiments, the methods can include storing data for the root process in flash memory. In some embodiments, the methods can include storing data for the root process in NVRAM. The NVRAM can include 3D XPoint memory.

In some embodiments, a non-transitory computer-readable storage medium tangibly encoded with computer-executable instructions, that when executed by a processor associated with a computing device, performs a method that can include monitoring, in a mobile device, usage of a plurality of applications to determine frequency or recency of reads from and writes to memory for each of the plurality of applications. The method can include storing data related to the usage of the plurality of applications. The method can include grouping the plurality of applications into groups according to queries of the data related to the usage. And, the method can include executing a root process for a group of the groups according to stored data common to each application in the group. In such embodiments, the method can include generating patterns of prior executions shared amongst the applications in the group based on the stored data common to each application in the group. And, the method can include executing the root process according to patterns of prior executions shared amongst the applications in the group. Also, in such embodiments, the method can include receiving a request to start at least one of the applications from the group from a user of the mobile device. The method can also include starting the at least one of the applications from the group in the mobile device upon receiving the request and by using the root process. The method can include forking the root process into multiple processes, and the method can include starting the at least one of the applications from the group upon receiving the request and by using at least one of the multiple processes according to the request.

Figure 7:
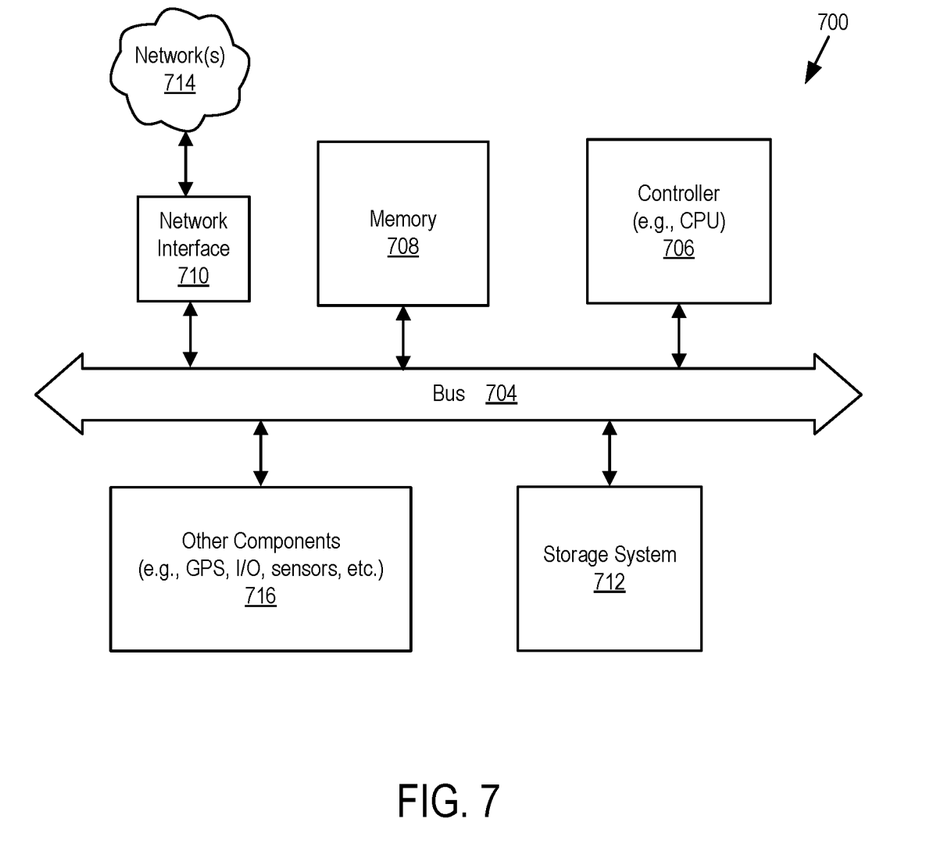
FIG. 7 illustrates an example computing device that can implement customized root processes for multiple groups of applications, in accordance with some embodiments of the present disclosure.

FIG. 7 illustrates an example computing device that can implement customized root processes for multiple groups of applications, in accordance with some embodiments of the present disclosure. The device 700 can be or include or be a part of mobile device 102 or any other type of computing device that is or is somewhat similar to a mobile device—such as a smartphone, tablet computer, IoT device, smart television, smart watch, glasses or other smart household appliance, in-vehicle information system, wearable smart device, game console, PC, digital camera, or any combination thereof. As shown, the device 700 can be connected to communications network(s) 714 that includes at least a wide area network (WAN), a local area network (LAN), an intranet, a mobile wireless network such as 4G or 5G, an extranet, the Internet, and/or any combination thereof.

Each of the computing or mobile devices described herein (such as mobile device 102 or computing device 700) can be or be replaced by a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine.

Also, while a single machine is illustrated for the device 700 shown in FIG. 7 as well as the mobile device 102 shown in FIGS. 1 and 4, the term "machine" shall also be taken to include any collection of machines that individually or jointly execute a set (or multiple sets) of instructions to perform any one or more of the methodologies or operations discussed herein. And, each of the illustrated computing or mobile devices can each include at least a bus and/or motherboard, one or more controllers (such as one or more CPUs), a main memory that can include temporary data storage, at least one type of network interface, a storage system that can include permanent data storage, and/or any combination thereof. In some multi-device embodiments, one device can complete some parts of the methods described herein, then send the result of completion over a network to another device such that another device can continue with other steps of the methods described herein.

FIG. 7 also illustrates example parts of the example computing device 700, in accordance with some embodiments of the present disclosure. The device 700 can be communicatively coupled to the network(s) 714 as shown. The device 700 includes at least a bus 704, a controller 706 (such as a CPU), memory 708, a network interface 710, a data storage system 712, and other components 716 (which can be any type of components found in mobile or computing devices such as GPS components, I/O components, and sensors). The other components 716 can include one or more displays, different types of sensors, audio and/or visual input/output devices, additional application-specific memory, one or more additional controllers (e.g., GPU), or any combination thereof. The bus 704 communicatively couples the controller 706, the memory 708, the network interface 710, the data storage system 712 and the other components 716. The device 700 includes a computer system that includes at least controller 706, memory 708 (e.g., read-only memory (ROM), flash memory, dynamic random-access memory (DRAM) such as synchronous DRAM (SDRAM) or Rambus DRAM (RDRAM), static random-access memory (SRAM), etc.), and data storage system 712, which communicate with each other via bus 704 (which can include multiple buses).

To put it another way, FIG. 7 is a block diagram of an example device 700 having a computer system in which embodiments of the present disclosure can operate. In some embodiments, the computer system can include a set of instructions, for causing a machine to perform any one or more of the methodologies discussed herein, when executed. In such embodiments, the machine can be connected (e.g., networked via network interface 710) to other machines in a LAN, an intranet, an extranet, and/or the Internet (e.g., network(s) 714). The machine can operate in the capacity of a server or a client machine in client-server network environment, as a peer machine in a peer-to-peer (or distributed) network environment (such as the peer-to-peer networks described herein), or as a server or a client machine in a cloud computing infrastructure or environment.

Controller 706 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, single instruction multiple data (SIMD), multiple instructions multiple data (MIMD), or a processor implementing other instruction sets, or processors implementing a combination of instruction sets. Controller 706 can also be one or more special-purpose processing devices such as an application specific integrated circuit (ASIC), a field programmable gate array (FPGA), a digital signal processor (DSP), network processor, or the like. Controller 706 is configured to execute instructions for performing the operations and steps discussed herein. Controller 706 can further include a network interface device such as network interface 710 to communicate over one or more communications network (such as network(s) 714).

The data storage system 712 can include a machine-readable storage medium (also known as a computer-readable medium) on which is stored one or more sets of instructions or software embodying any one or more of the methodologies or functions described herein. The instructions can also reside, completely or at least partially, within the memory 708 and/or within the controller 706 during execution thereof by the computer system, the memory 708 and the controller 706 also constituting machine-readable storage media. The memory 708 can be or include main memory of the device 700.

While the memory, controller, and data storage parts are shown in the example embodiment to each be a single part, each part should be taken to include a single part or multiple parts that can store the instructions and perform their respective operations. The term "machine-readable storage medium" shall also be taken to include any medium that is capable of storing or encoding a set of instructions for execution by the machine and that cause the machine to perform any one or more of the methodologies of the present disclosure. The term "machine-readable storage medium"

shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    monitoring, in a mobile device, usage of a plurality of applications to determine memory access for each of the plurality of applications;
    storing data related to the usage of the plurality of applications;
    grouping the plurality of applications into groups according to data related to usage of the plurality of applications; and
    executing a root process for a group of the groups of applications according to usage common to each application in the group, to a point common to the applications in the group.

2. The method of claim 1, wherein at least one of the monitoring, storing, grouping, or executing is performed by an operating system (OS) in the mobile device, and wherein determining memory access comprises measuring frequency or recency of reads from and writes to memory.

3. The method of claim 1, comprising:
    generating patterns of prior executions shared amongst the applications in the group based on the data in the database common to each application in the group; and
    executing the root process according to the patterns of prior executions shared amongst the applications in the group.

4. The method of claim 3, comprising:
    receiving a request to start at least one of the applications from the group from a user of the mobile device; and
    starting the at least one of the applications from the group in the mobile device upon receiving the request and by using the process.

5. The method of claim 4, comprising:
    forking, by an operating system (OS) in the mobile device, the process into multiple processes; and
    starting, by the OS, the at least one of the applications from the group upon receiving the request and by using at least one of the multiple processes according to the request.

6. The method of claim 4, wherein the monitoring of the usage of the plurality of applications is for the usage of the plurality of applications by the user so that the root process is customized for use of the applications on the mobile device by the user.

7. The method of claim 4, comprising:
    receiving, from the user of the mobile device, a request to end the at least one of the applications from the group;
    at least partially ending the at least one of the applications from the group and the process upon receiving the request to end the at least one of the applications from the group; and
    after at least partially ending the at least one of the applications from the group and the root process, at least partially re-executing the process according to a predetermined condition.

8. The method of claim 7, wherein the at least partially re-executing of the root process is based on or updated by the patterns of prior executions shared amongst the applications in the group.

9. The method of claim 4, comprising:
receiving from the user of the mobile device a request to end the at least one of the applications from the group;
at least partially ending the at least one of the applications from the group upon receiving the request to end the at least one of the applications from the group; and
continuing to run the root process upon receiving the request to end the at least one of the applications from the group.

10. The method of claim 1, wherein the monitoring of the usage of the plurality of applications is for the usage of the plurality of applications by any user of the mobile device so that the root process is customized for use of the application on the mobile device by any user.

11. The method of claim 1, wherein executing the process for the group comprises copying data in memory before any initial writes to memory for the group, and wherein the copying data in memory before any initial writes to memory comprises avoiding copying common code and read-only data.

12. The method of claim 1, comprising storing data for the process in flash memory.

13. The method of claim 1, comprising storing data for the process in non-volatile random-access memory (NVRAM).

14. The method of claim 13, wherein the NVRAM comprises 3D XPoint memory.

15. A non-transitory computer-readable storage medium tangibly encoded with computer-executable instructions, that when executed by a processor associated with a computing device, performs a method, the method comprising:
monitoring, in a mobile device, usage of a plurality of applications to determine frequency or recency of reads from and writes to memory for each of the plurality of applications;
storing data related to the usage of the plurality of applications;
grouping the plurality of applications into groups according to queries of the data related to the usage;
executing a process for a group of the groups according to stored data common to each application in the group; and
executing the root process according to patterns of prior executions shared amongst the applications in the group.

16. The non-transitory computer-readable medium of claim 15, wherein the method comprises:
generating patterns of prior executions shared amongst the applications in the group based on the stored data common to each application in the group.

17. The non-transitory computer-readable medium of claim 16, wherein the method comprises:
receiving a request to start at least one of the applications from the group from a user of the mobile device; and
starting the at least one of the applications from the group in the mobile device upon receiving the request and by using the process.

18. The non-transitory computer-readable medium of claim 16, wherein the method comprises:
receiving a request to start at least one of the applications from the group from a user of the mobile device;
forking, by an operating system (OS) in the mobile device, the root process into multiple processes; and
starting, by the OS, the at least one of the applications from the group upon receiving the request and by using at least one of the multiple processes according to the request.

19. A method, comprising:
monitoring, by an operating system (OS) in a mobile device, usage of a plurality of applications to determine frequency or recency of reads from and writes to memory for each of the plurality of applications;
storing, by the OS, data related to the usage of the plurality of applications in a database;
grouping, by the OS, the plurality of applications into groups according to queries of the database;
executing, by the OS, a process for a group of the groups as a background process according to data in the database common to each application in the group; and
executing the root process according to patterns of prior executions shared amongst the applications in the group.

* * * * *